United States Patent [19]

Asano et al.

[11] Patent Number: 5,041,865

[45] Date of Patent: Aug. 20, 1991

[54] IMAGE RECORDING APPARATUS WITH EXPOSURE AMOUNT CONTROLLING CAPABILITY DEPENDENT UPON TEMPERATURE/HUMIDITY CHANGES

[75] Inventors: Yuji Asano, Nagoya; Naoyuki Hatta, Gamagori, both of Japan

[73] Assignee: Brother Kogyo Kabushiki Kaisha, Japan

[21] Appl. No.: 599,985

[22] Filed: Oct. 19, 1990

[30] Foreign Application Priority Data

Oct. 26, 1989 [JP] Japan .................................. 1-279218

[51] Int. Cl.⁵ .............................................. G03B 27/52
[52] U.S. Cl. ........................................ 355/30; 354/299
[58] Field of Search ...................... 355/27, 30, 53, 68; 430/138, 327; 354/299–302

[56] References Cited

U.S. PATENT DOCUMENTS

| 4,367,036 | 1/1983 | Sakamaki et al. | 355/30 X |
|---|---|---|---|
| 4,699,505 | 10/1987 | Komoriya et al. | 355/53 X |
| 4,704,348 | 11/1987 | Koizumi et al. | 430/327 |
| 4,786,947 | 11/1988 | Kosugi e al. | 355/30 |
| 4,853,743 | 8/1989 | Nagumo et al. | 355/27 |
| 4,919,531 | 4/1990 | Mashiko et al. | 355/27 |
| 4,943,827 | 7/1990 | Good et al. | 355/30 |
| 4,974,018 | 11/1990 | Komoriya et al. | 355/53 |
| 4,982,224 | 1/1991 | Yamamoto et al. | 355/27 |
| 4,982,225 | 1/1991 | Sakakibara et al. | 355/30 |
| 4,994,856 | 2/1991 | Koichi | 355/68 |

Primary Examiner—Richard A. Wintercorn
Attorney, Agent, or Firm—Oliff & Berridge

[57] ABSTRACT

An image recording apparatus adapted to record an image on an image receiving sheet selected from plural kinds of sheets using a photosensitive recording medium, wherein the photosensitive recording medium is exposed to light emitted from an exposure lamp to form a latent image thereon. In view of the fact that a photosensitivity of the recording medium varies depending upon ambient temperature and/or humidity, at least the ambient temperature is detected so that an exposure amount applied to the photosensitive recording medium is controlled in response to the sensed temperature and the kind of the sheet on which the image is formed.

10 Claims, 2 Drawing Sheets

IMAGE RECORDING APPARATUS WITH EXPOSURE AMOUNT CONTROLLING CAPABILITY DEPENDENT UPON TEMPERATURE/HUMIDITY CHANGES

BACKGROUND OF THE INVENTION

The present invention relates generally to an image recording apparatus, and more particularly to an exposure device incorporated in an image recording apparatus, such as a copying machine, facsimile equipment or the like.

U.S. Pat. No. 4,399,209 to Sanders et al discloses a photosensitive pressure-sensitive recording medium having a surface coated with an immense number of photo-curable microcapsules encapsulating a chromogenic material therein. For the recordation of an image, the recording medium is exposed to an imaging light to selectively photocure the microcapsules and to thus form a latent image thereon. Thereafter, the recording medium and a separate image receiving sheet having a surface coated with a developer material are brought to facial contact with each other and are subjected to pressure development to rupture the microcapsules which remain uncured and to react the chromogenic material released from the ruptured microcapsules with the developer material. As a result, a visible image is formed and transferred onto the image receiving sheet.

In the photosensitive pressure-sensitive recording media of the type described above, it has been known that the photosensitivity thereof varies depending upon ambient temperature and/or humidity. Due to the fact that the ambient temperature and/or humidity usually vary depending upon weather, time, etc, the image recording is not always performed under the most suitable condition and thus the quality of the image as reproduced cannot be maintained at a constant level. Even if both the temperature and humidity were maintained unchanged, the ambient temperature and humidity would vary due to the heat generated from an exposure lamp, thereby causing to vary the photosensitivity of the recording medium. Therefore, the same level image quality cannot be constantly obtained even if the temperature and the humidity were set to predetermined constants and the same amount of light were applied onto the recording medium for exposure.

Furthermore, although the image receiving sheet is substantially not affected by temperature and humidity, the image transfer to the image receiving sheet is degraded as the ambient humidity exceeds about 70%, and the developer material coated on the surface of the image receiving sheet is liable to be peeled off as the ambient temperature raises above about 40 centigrade. In addition, with respect to an image receiving sheet using a transparent film as the substrate material, which is used in an overhead projector, the image formed thereon is light in density as compared with the image formed on an image receiving sheet whose substrate material is a paper.

SUMMARY OF THE INVENTION

The present invention has been made to solve the foregoing problems, and accordingly it is a primary object of the present invention to provide an image recording apparatus which can constantly afford images of stabilized quality without being affected by ambient temperature and/or humidity changes.

It is another object of the present invention to provide an image recording apparatus in which images formed on image receiving sheets are substantially of the same density irrespective of the substrate materials of the image receiving sheets.

To achieve the above and other objects, there is provided an image recording apparatus adapted to record an image on a sheet selected from plural kinds of sheets, which comprises exposure means for exposing a photosensitive recording medium to an imaging light to form a latent image thereon, the exposure means including an exposure lamp which emits a light, identifying means for identifying the selected sheet and providing an identifying signal indicative thereof, first sensing means for sensing ambient temperature around the photosensitive recording medium and providing a temperature signal indicative thereof, and control means responsive to both the identifying signal and the temperature signal for controlling an exposure amount applied to the photosensitive recording medium.

In addition to the provision of the first sensing means, second sensing means may be provided for sensing ambient humidity around the photosensitive recording medium. The second sensing means provides a humidity signal indicative of the sensed humidity. The control means then controls the exposure amount applied to the photosensitive recording medium in further response to the humidity signal.

Further, with the provision of only the humidity sensor, the exposure amount may be controlled in response only to the humidity signal.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENTS

An image recording apparatus according to one preferred embodiment of the present invention will be described with reference to FIG. 1.

In the embodiment of the invention, a transfer type image recording medium as disclosed in U.S. Pat. No. 4,399,209 to Sanders et al is used as a photosensitive pressure-sensitive recording medium. Briefly, this recording medium has a surface coated with an immense number of microcapsules encapsulating a photocuring resin and a chromogenic material of one of three primary colors, i.e., cyan, magenta and yellow. An image receiving member to be used in cooperation with the microcapsule sheet has a surface coated with a developer material.

Figure 1:
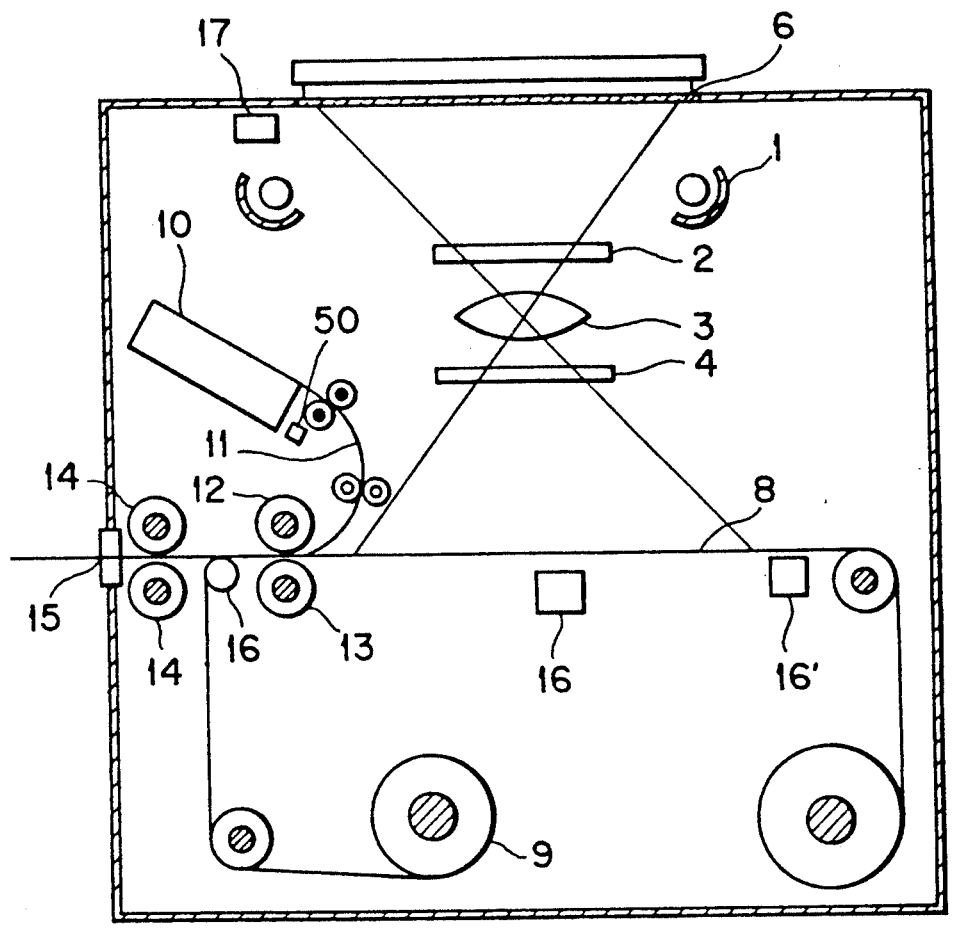
FIG. 1 is a schematic cross-sectional view showing an image recording apparatus according to one embodiment of the present invention.

The apparatus shown in FIG. 1 is of a reflection type wherein a light emitted from a light source 1 is irradiated onto an original document 6 and a light reflected therefrom is applied onto a photosensitive pressure-sensitive recording medium 8 for exposure through an optical system including a shutter 2, a focusing lens 3, and a color separation filter 4. The filter 4 includes red, green, and blue filter elements which are selectively placed in the optical path. The recording medium 8 is in the form of an elongated, web-like sheet and is loaded in the apparatus in a rolled state. The recording medium 8 is unrolled and extended to pass through an exposure region, and wound around a take-up roller 9. A developer sheet 11 as the image receiving sheet is in the form of a cut sheet and is stored in a sheet cassette 10 in a stacked condition. The substrate of the developer sheet 11 may either be a paper or a transparent film sheet or other material. The uppermost developer sheet 11 is fed out in timed relation to the conveyance of the recording medium 8 and is brought into facial contact with the recording medium 8 when they are introduced into a nip between a pressurizing roller 12 and a platen roller 13.

The pressurizing roller 12 and the platen roller 13 serve as a pressure developing unit for pressure developing the latent image formed on the recording medium 8. After the pressure development, the developer sheet 11 on which a visible image is formed is separated from the recording medium 8 by the aid of a separation roller 16 and is introduced into a thermal fixing unit which comprises a pair of heat rollers 14, 14. The developer sheet 11 which has been subjected to the thermal fixing is then discharged out of the apparatus through a discharge port 15.

A thermistor 16 is disposed immediately below a path of the recording medium 8 for sensing ambient temperature. The surface temperature of the recording medium 8 may be directly sensed rather than sensing the ambient temperature. To this effect, a temperature sensor 16' may be disposed in contact with the reverse side of the recording medium 8. The output of the thermistor 16 or the temperature sensor 16' is fed to a control circuit 32 (to be described later) for controlling the exposure amount.

In a position offset from the path of the light reflected from the original document 1 but capable of directly receiving the light from the light source 1, there is disposed a photodiode 17 for sensing an amount of light emitted from the light source 1. The output of the photodiode 17 is also fed to the control circuit 32 to be described far more in detail below.

An OHP (overhead projector) sensor 50, serving as sheet identifying means, is disposed in confrontation with the sheet cassette 10 in which stored are a stack of OHP sheets. The OHP sheet has a transparent film substrate on which the developer material is coated. To a front frame of the cassette 10 confronting the sensor 50, a plate-like piece is attached which is sensed by the sensor 50. From the output of the sensor 50, the sheet stored in the sheet cassette 10 is identified. Instead of the sensor 50, an operation panel 51, which also serves as the sheet identifying means, may be connected to a microcontroller 21 (to be described later with reference to FIG. 2) to directly input the kind of the developer sheet through key manipulations.

Figure 2:
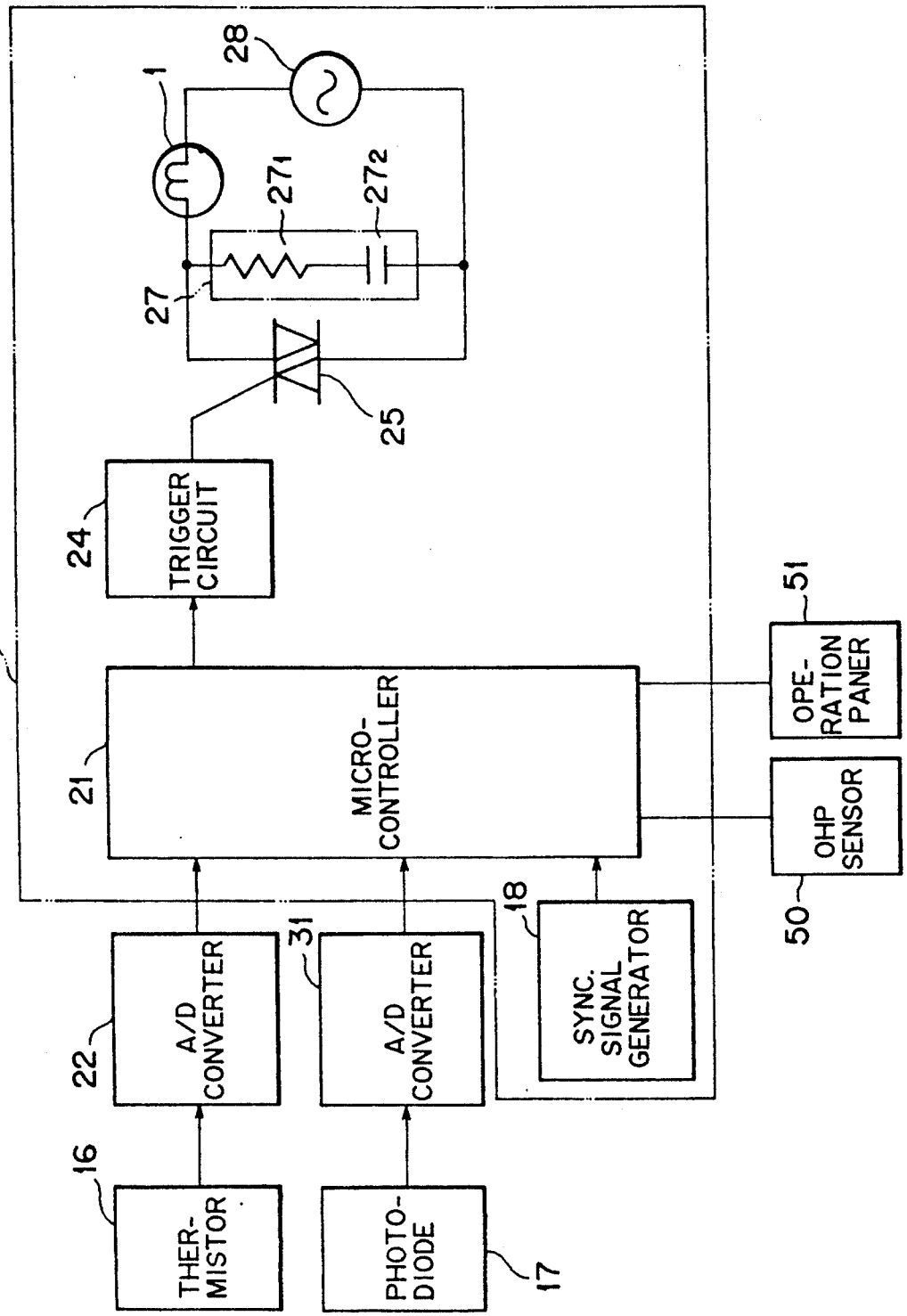
FIG. 2 is a block diagram showing a control circuit incorporated in the recording apparatus shown in FIG. 1.

Next, the control circuit 32 will be described with reference to FIG. 2 illustrated in block form.

The light source 1, an AC power supply 28, and a triode AC semiconductor switch (hereinafter referred to as "triac") 25 are connected in series, and a surge absorbing circuit 27 made up of a series connection of a resistor $27_1$ and a capacitor $27_2$ is connected in parallel to the triac 25. A microcontroller 21 is coupled to the triac 25 through a trigger circuit 24. To the microcontroller 21, the thermistor 16 and the photodiode 17 are connected through analog-to-digital (A/D) converters 22, 31, respectively. Further, the OHP sensor 50 and the operation panel 51 are connected to the microcontroller 21. A synchronizing signal generator 18 is connected to the microcontroller 21 for feeding synchronizing signals thereto.

Figure 3A:
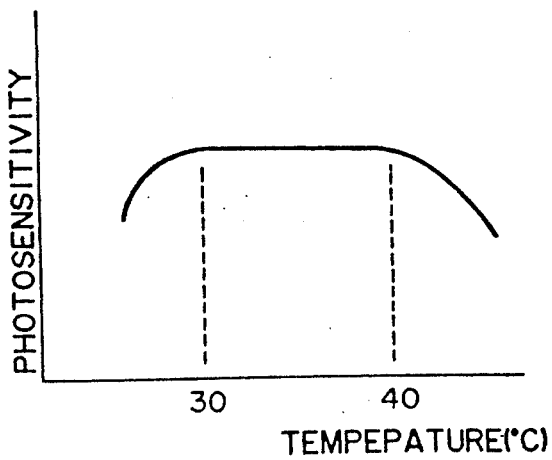
FIG. 3A is a graphical representation showing a relation between temperature and photosensitivity of a photosensitive recording medium.
Figure 3B:
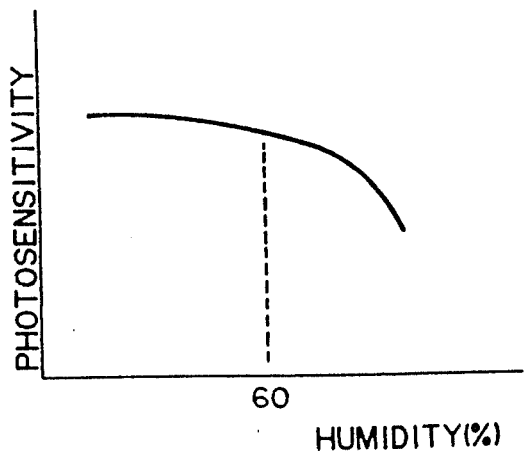
FIG. 3B is a graphical representation showing a relation between humidity and photosensitivity of the photosensitive recording medium.

The microcontroller 21 has a memory (not shown) in which the characteristic data shown in FIGS. 3A and 3B are stored. Exposure amount correction data is further stored therein in relation to the substrate material of the developer sheet 11. Specifically, the image formed on the OHP developer sheet 11 is light in density as compared with the image formed on the developer sheet 11 using a paper as a substrate material. To increase the density of the image formed on the OHP developer sheet 11 so as to have the same density level as the paper substrate developer sheet 11, the exposure amount applied to the recording medium 8 needs to be increased relative to the exposure amount applied to the paper substrate developer sheet 11. For this reason, the exposure amount correction data is necessary.

In operation, a trigger signal is applied to the triac 25 from the trigger circuit 24 in timed relation to the synchronizing signal fed to the microcontroller 21 from the synchronizing signal generator 18. In response to the trigger signal, the triac 25 is rendered conductive, thereby allowing the light source 1 to light. The amount of light emitted from the light source 1 is sensed by the photodiode 17 and the output thereof is fed back to the microcontroller 21 through an A/D converter 31. Based on the digital signal fed from the A/D converter 31, the microcontroller 21 determines a firing angle of the triac 25. If the firing angle is increased, the amount of the light emitted from the light source 1 is increased, whereas if the same is decreased, the amount thereof is decreased.

Ambient temperature detected by the thermistor 16 is subjected to A/D conversion by an A/D converter 31 and the resultant digital signal is applied to the microcontroller 21. Instead of the ambient temperature, the surface temperature of the recording medium 8 sensed by the sensor 16' may be subjected to A/D conversion and the resultant digital signal may be applied to the microcontroller 21. Further, data regarding the substrate material of the developer sheet is supplied to the microcontroller 21 through the sensor 50 or the operation panel 51. Based on the signal indicative of the ambient temperature or the surface temperature data of the recording medium 8 and the developer sheet substrate material data, the firing angle which has been determined in response to the output from the photodiode 30 is corrected. The firing angle of the triac 25 is finally determined by the corrected firing angle, whereby the amount of light emitted from the light source 1 is controlled. In this manner, when the photosensitivity of the recording medium 1 is lowered due to the temperature change, the firing angle is increased to thereby increase the amount of light emitted from the light source 1 whereas when the photosensitivity is increased, the firing angle is decreased to thereby decrease the amount of light. Further, when the OHP developer sheet 11 is used, the firing angle is decreased.

As shown in FIG. 3A, an optimum photosensitivity of a recording medium lies in the range of 30 to 40 centigrade in ambient temperature. The photosensitivity of the recording medium is lowered if the ambient temperature raises above or falls below the above temperature range. If the ambient temperature raises above 40 centigrade, the amount of light emitted from the light source 1 is increased so as to compensate for the lowering of the photosensitivity. As described, the amount of light emitted from the light source is controlled to compensate for the change of the photosensitivity of the recording medium caused by the change of the ambient temperature. Therefore, a stable image reproduction can be accomplished.

In the above embodiment, although only the ambient temperature around the recording medium is detected, humidity around the recording medium may further be detected to more precisely control the exposure amount. As shown in FIG. 3B, the photosensitivity of the recording medium 8 is lowered if the ambient humidity exceeds 60% and the an allowable humidity range is believed be 40 to 70%. Therefore, in response to the humidity as detected, the firing angle of the triac 25 may further be corrected.

Further, the photosensitivity (γ value) of the magenta microcapsule is large under a low temperature and a high humidity or under a mid-range temperature (30 to 40 centigrade) and low humidity. The photosensitivity of the cyan microcapsule is large under a low temperature and a high humidity. On the other hand, the photosensitivity of the yellow microcapsule is substantially not affected by the temperature and humidity. Accordingly, when the ambient temperature is low and the humidity is high, the sensitivity of both the magenta and cyan microcapsules are increased, so that the correction to the firing angle may be increased only when the magenta and cyan microcapsules arc exposed to light.

Although the present invention has been described with reference to a specific embodiment, it would be apparent for those skilled in the art that a variety of changes and modifications may be made without departing from the scope and spirit of the invention. For example, although in the above embodiment, a microcapsule sheet is used for recording an image, other kinds of photosensitive pressure-sensitive sheet or photosensitive sheet may be used. Further, in the above embodiment, the amount of exposure is varied depending upon the change of the photosensitivity of the recording medium caused by the temperature and/or humidity, and the substrate material of the developer sheet, however, the feeding speed of the recording medium may be changed while maintaining the amount of light emitted from the light source at a constant level. To adjust the amount of light emitted from the light source, a variable resistor may be connected in place of the triac 25.

The recording apparatus to which the present invention is applied is not limited to the reflection exposure type but the invention is also applicable to a slit exposure type recording apparatus or other types of recording apparatuses.

What is claimed is:

1. An image recording apparatus adapted to record an image on a medium selected from plural kinds of media, comprising:
   exposure means for exposing a photosensitive recording medium to an imaging light to form a latent image thereon, said exposure means including an exposure lamp which emits a light;
   identifying means for identifying the selected medium and providing an identifying signal indicative thereof;
   first sensing means for sensing ambient temperature around the photosensitive recording medium and providing a temperature signal indicative thereof; and
   control means responsive to both the identifying signal and the temperature signal for controlling an exposure amount applied to the photosensitive recording medium.

2. An image recording apparatus according to claim 1, wherein said exposure means further includes an AC power supply for applying an AC voltage to said exposure lamp, and a switching element for controlling the application of the AC voltage to said exposure lamp, said switching element having a trigger terminal coupled to said control means and being cyclically rendered conductive for a duration determined by both the identifying signal and the temperature signal.

3. An image recording apparatus according to claim 1, further comprising second sensing means for sensing ambient humidity around the photosensitive recording medium and providing a humidity signal indicative thereof, and wherein said control means controls the exposure amount applied to the photosensitive recording medium in further response to the humidity signal.

4. An image recording apparatus according to claim 3, wherein said exposure means further includes an AC power supply for applying an AC voltage to said exposure lamp, and a switching element for controlling the application of the AC voltage to said exposure lamp, said switching element having a trigger terminal coupled to said control means and being cyclically rendered conductive for a duration determined by the identifying signal, the temperature signal and the humidity signal.

5. An image recording apparatus adapted to record an image on a medium selected from plural kinds of media, comprising:
   exposure means for exposing a photosensitive recording medium to an imaging light to form a latent image thereon, said exposure means including an exposure lamp which emits a light;
   identifying means for identifying a selected medium and providing an identifying signal indicative thereof;
   first sensing means for sensing a surface temperature of the photosensitive recording medium and providing a temperature signal indicative thereof; and
   control means responsive to both the identifying signal and the temperature signal for controlling an exposure amount applied to the photosensitive recording medium.

6. An image recording apparatus according to claim 5, wherein said exposure means further includes an AC power supply for applying an AC voltage to said exposure lamp, and a switching element for controlling the application of the AC voltage to said exposure lamp, said switching element having a trigger terminal coupled to said control means and being cyclically rendered conductive for a duration determined by both the identifying signal and the temperature signal.

7. An image recording apparatus according to claim 5, further comprising second sensing means for sensing ambient humidity around the photosensitive recording medium and providing a humidity signal indicative thereof, and wherein said control means controls the exposure amount applied to the photosensitive recording medium in further response to the humidity signal.

8. An image recording apparatus according to claim 7, wherein said exposure means further includes an AC power supply for applying an AC voltage to said exposure lamp, and a switching element for controlling the application of the AC voltage to said exposure lamp, said switching element having a trigger terminal coupled to said control means and being cyclically rendered conductive for a duration determined by the identifying signal, the temperature signal and the humidity signal.

9. An image recording apparatus adapted to record an image on a medium selected from plural kinds of media, comprising:

exposure means for exposing a photosensitive recording medium to an imaging light to form a latent image thereon, said exposure means including an exposure lamp which emits a light;

identifying means for identifying the selected medium and providing an identifying signal indicative thereof;

sensing means for sensing ambient humidity around the photosensitive recording medium and providing a humidity signal indicative thereof; and control means responsive to both the identifying signal and the humidity signal for controlling an exposure amount applied to the photosensitive recording medium.

10. An image recording apparatus according to claim 9, wherein said exposure means further includes an AC power supply for applying an AC voltage to said exposure lamp, and a switching element for controlling the application of the AC voltage to said exposure lamp, said switching element having a trigger terminal coupled to said control means and being cyclically rendered conductive for a duration determined by both the identifying signal and the humidity signal.

* * * * *